(12) United States Patent
Ward et al.

(10) Patent No.: US 8,802,522 B2
(45) Date of Patent: Aug. 12, 2014

(54) METHODS TO ADJUST THRESHOLD VOLTAGE IN SEMICONDUCTOR DEVICES

(75) Inventors: Michael G. Ward, Niskayuma, NY (US); Igor V. Peidous, Loudonville, NY (US); Sunny Chiang, Loudonville, NY (US); Yen B. Ta, Pomona, CA (US); Andrew Darlak, Niskayuna, NY (US); Peter I. Porshnev, Poway, CA (US); Swaminathan Srinivasan, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 45 days.

(21) Appl. No.: 13/190,012

(22) Filed: Jul. 25, 2011

(65) Prior Publication Data
US 2012/0171855 A1    Jul. 5, 2012

Related U.S. Application Data

(60) Provisional application No. 61/381,914, filed on Sep. 10, 2010.

(51) Int. Cl.
*H01L 29/94* (2006.01)
(52) U.S. Cl.
USPC ........... 438/199; 438/216; 438/287; 438/592; 257/E21.615
(58) Field of Classification Search
USPC ......... 438/199, 216, 261, 287, 275, 591, 592; 257/E21.615, E21.616, E21.625, 257/E21.632
See application file for complete search history.

(56) References Cited

U.S. PATENT DOCUMENTS

| | | | |
|---|---|---|---|
| 6,891,233 B2 | 5/2005 | Lin et al. | |
| 7,122,415 B2 | 10/2006 | Jang et al. | |
| 7,202,535 B2 | 4/2007 | Goldbach et al. | |
| 7,754,551 B2 | 7/2010 | Chin | |
| 2004/0106261 A1 | 6/2004 | Huotari et al. | |
| 2007/0272967 A1 | 11/2007 | Pantisano et al. | |
| 2008/0160736 A1 | 7/2008 | Alshareef et al. | |
| 2008/0233694 A1 | 9/2008 | Li | |
| 2009/0090971 A1 | 4/2009 | Chang et al. | |
| 2009/0134466 A1 | 5/2009 | Cho et al. | |
| 2009/0253253 A1 | 10/2009 | Xiong et al. | |
| 2010/0052077 A1 | 3/2010 | Hsu et al. | |
| 2010/0109098 A1 | 5/2010 | Lin et al. | |
| 2010/0155854 A1* | 6/2010 | Stahrenberg et al. | 257/392 |

OTHER PUBLICATIONS

International Search Report and Written Opinion mailed Feb. 28, 2012 for PCT Application No. PCT/US2011/045320.

* cited by examiner

*Primary Examiner* — Thanhha Pham
(74) *Attorney, Agent, or Firm* — Moser Taboada; Alan Taboada (57) ABSTRACT

Methods for forming a device on a substrate are provided herein. In some embodiments, a method of forming a device on a substrate may include providing a substrate having a partially fabricated first device disposed on the substrate, the first device including a first film stack comprising a first dielectric layer and a first high-k dielectric layer disposed atop the first dielectric layer; depositing a first metal layer atop the first film stack; and modifying a first upper surface of the first metal layer to adjust a first threshold voltage of the first device, wherein the modification of the first upper surface does not extend through to a first lower surface of the first metal layer.

20 Claims, 5 Drawing Sheets

METHODS TO ADJUST THRESHOLD VOLTAGE IN SEMICONDUCTOR DEVICES

CROSS-REFERENCE TO RELATED APPLICATIONS

This application claims benefit of U.S. provisional patent application Ser. No. 61/381,914, filed Sep. 10, 2010, which is herein incorporated by reference.

FIELD

Embodiments of the present invention generally relate to methods of forming semiconductor devices.

BACKGROUND

Different device types, such as n-type metal oxide semiconductor (NMOS) devices or p-type metal oxide semiconductor (PMOS) devices, typically require substantially different compositions of equivalent layers in their respective gate stacks to achieve the desired threshold voltages necessary to operate each device. For example, different devices may require different compositions of one or more of a high-k dielectric layer or a metal layer in their respective gate stacks to achieve threshold voltages necessary to operate each device. The requirement of different layers having different compositions typically requires multiple masking and deposition steps to deposit each layer, adding to the cost and time of manufacturing.

Accordingly, the inventors have developed the improved methods of forming semiconductor devices.

SUMMARY

Methods for forming a device on a substrate are provided herein. In some embodiments, a method of forming a device on a substrate may include providing a substrate having a partially fabricated first device disposed on the substrate, the first device including a first film stack comprising a first dielectric layer and a first high-k dielectric layer disposed atop the first dielectric layer; depositing a first metal layer atop the first film stack; and modifying a first upper surface of the first metal layer to adjust a first threshold voltage of the first device, wherein the modification of the first upper surface does not extend through to a first lower surface of the first metal layer.

In some embodiments, the method may further comprise modifying a first upper surface of the first high-k dielectric layer to adjust the first work function of the first gate stack prior to depositing the first metal layer, wherein the modification of the first upper surface of the first high-k dielectric layer does not extend through to a first lower surface of the first high-k dielectric layer.

In some embodiments, a partially fabricated second device is disposed on the substrate, wherein the second device includes a second film stack comprising a second dielectric layer and a second high-k dielectric layer disposed atop the second dielectric layer, wherein the second dielectric layer is substantially equivalent in composition to the first dielectric layer of the first film stack and wherein the second high-k dielectric layer is substantially equivalent in composition to the first high-k dielectric layer.

In some embodiments, the method may further comprise depositing a second metal layer atop the second film stack simultaneously with the deposition of the first metal layer, wherein the second metal layer is substantially equivalent in composition to the first metal layer.

In some embodiments, the first threshold voltage of the first device is different than a second threshold voltage of the second device. In some embodiments, the first device is an NMOS device and the second device is a PMOS device. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming semiconductor devices on substrates are disclosed herein. At least some embodiments of the inventive methods may advantageously reduce the number of process steps required to manufacture, for example, a complementary metal oxide semiconductor (CMOS) device including both an n-type metal oxide semiconductor (NMOS) device and p-type metal oxide semiconductor (PMOS) device on the same substrate, or any one or more NMOS and/or PMOS devices on the same substrate. At least some embodiments of the inventive methods may facilitate increased process throughput due to the reduced number of process steps.

Figure 1:
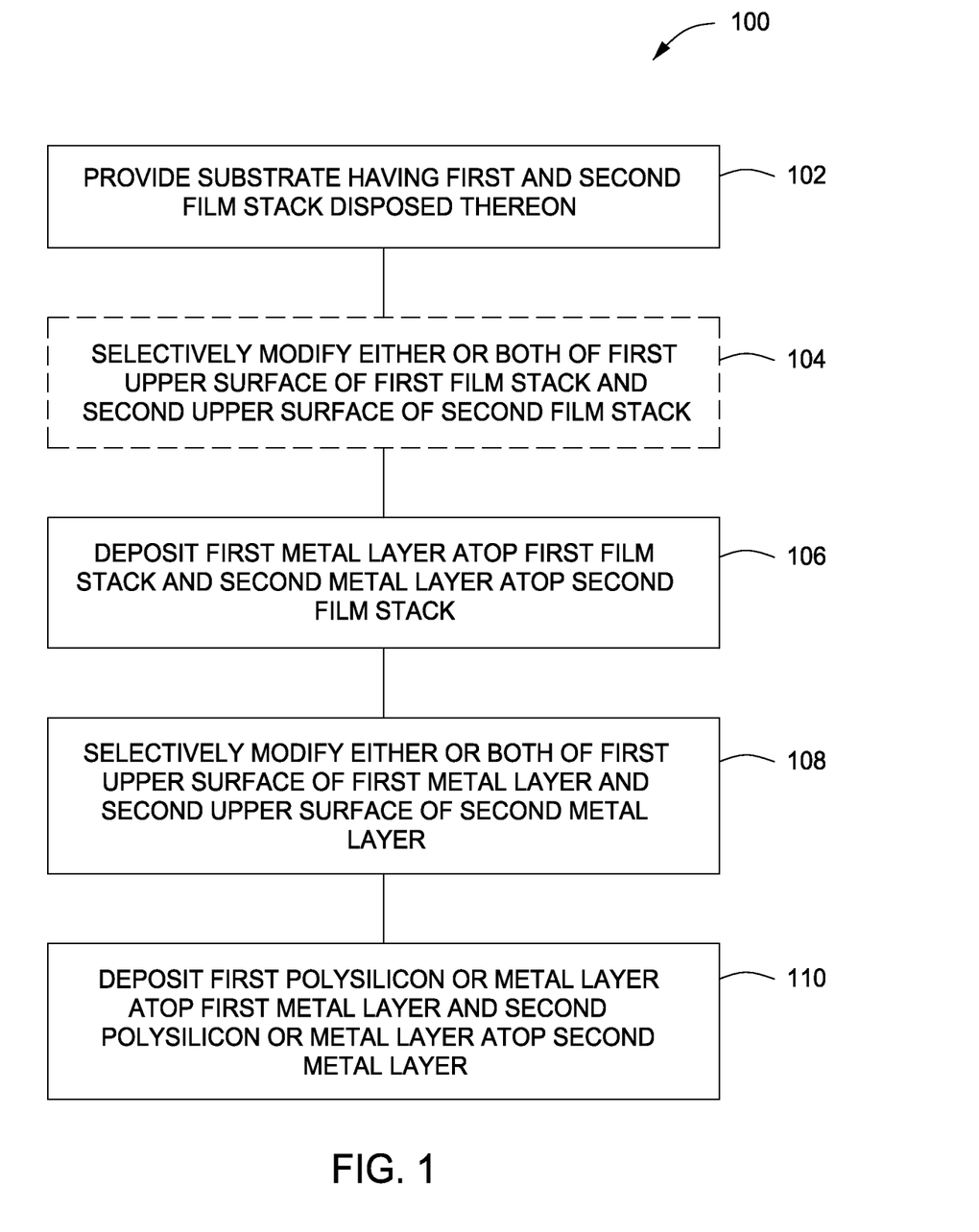
FIG. 1 depicts a flow chart for a method of forming a device in accordance with some embodiments of the present invention.
Figure 2A:
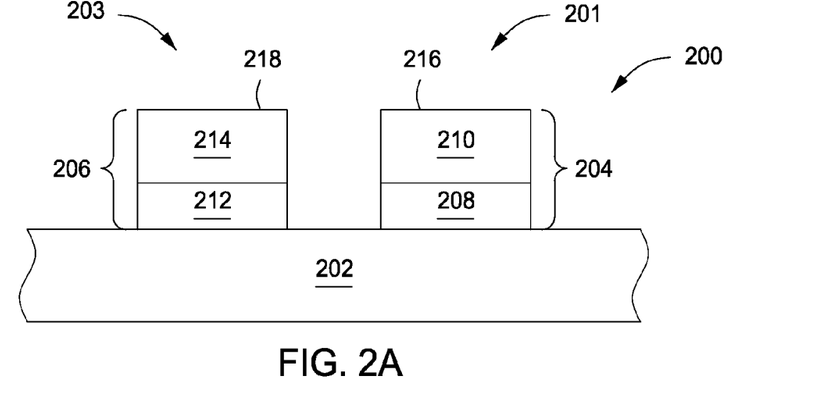
FIGS. 2A-F depicts the stages of fabrication of a device in accordance with some embodiments of the present invention.

FIG. 1 depicts a method 100 for forming a semiconductor device in accordance with some embodiments of the present invention. The method is described below in accordance with the stages of fabrication of a semiconductor device 200 depicted in FIGS. 2A-E. The method 100 generally begins at 102 by providing a partially fabricated semiconductor device (e.g., device 200). As illustrated in FIG. 2A, the partially fabricated device 200 includes a substrate 202 having a first film stack 204 and second film stack 206 disposed thereon. For example, the first and second film stacks 204, 206 may be part of respective first and second gate stacks of adjacent partially fabricated devices 201, 203, such as one or more of metal oxide semiconductor field effects transistors (MOSFET), dynamic random access memory (DRAM) cells, flash memory cells, or the like. Although the method 100 is described with respect to multiple gate stacks, embodiments of the method 100 may also be applied to single gate stacks, for example to adjust effective work function (EWF) and/or threshold voltage ($V_T$) of a device which includes the single gate stack, such as a MOSFET or the like.

The substrate 202 may have various dimensions, such as 200 or 300 mm diameter wafers, as well as rectangular or square panels. The substrate 202 may comprise a material such as crystalline silicon (e.g., Si<100>, Si<110> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. For example, a first region of the substrate 202 proximate the first film stack 204 may include a first channel (not shown) disposed beneath the first film stack 204 and first source/drain regions (not shown) disposed on opposing ends of the first channel. An exemplary second region of the substrate 202 proximate the second film stack 206 may include a second channel (not shown) disposed beneath the second film stack 206 and second source/drain regions (not shown) disposed on opposing ends of the second channel. For example, the first and second regions of the substrate 202 may be separated by an insulator (not shown), such a shallow trench isolation region (STI) or the like to prevent cross talk between adjacent devices.

The first film stack 204 may include a first dielectric layer 208 and first high-k dielectric layer 210 disposed atop the first dielectric layer 208. Similarly, the second film stack 206 may include a second dielectric layer 212 and a second high-k dielectric layer 214. The first and second dielectric layers 208, 212 may be substantially equivalent in composition. For example, in some embodiments, the first and second dielectric layers 208, 212 may be formed from a single deposited layer that is subsequently patterned, or that is simultaneously deposited into a patterned region, to define the first dielectric layer 208 and the second dielectric layer 212. The first and second dielectric layers 208, 212 may comprise a dielectric material having a dielectric constant of about 3.9, or in some embodiments, ranging from about 3.9 to about 7. The first and second dielectric layers 208, 212 may include one or more dielectric materials, such as at least one of silicon dioxide ($SiO_2$) silicon oxynitride (SiON), or other suitable dielectric materials. In some embodiments, the first and second dielectric layers 208, 212 comprise $SiO_2$. In some embodiments, the first and second dielectric layers 208, 212 may be substantially equivalent in thickness. Alternatively, the first and second dielectric layers 208, 212 may have different thicknesses depending on the type of device being constructed. In some embodiments, the first and second dielectric layers may excluded (e.g., not present). For example, a thickness of each of the first and second dielectric layers 208, 212, when present, may be up to about 7 angstroms.

The first and second high-k dielectric layers 210, 214 may be substantially equivalent in composition. For example, in some embodiments, the first and second high-k dielectric layers 210, 214 may be formed from a single deposited layer that is subsequently patterned, or that is simultaneously deposited into a patterned region, to define the first high-k dielectric layer 210 and the second high-k dielectric layer 214. The first and second high-k dielectric layers may comprises a high-k dielectric material, such a dielectric material having a dielectric constant that is greater than about 4, or that ranges from about 10 to about 80. The first and second high-k dielectric layers 210, 214 may include one or more high-k dielectric materials, such as at least one of silicon oxide ($SiO_2$), hafnium oxide ($HfO_2$), zirconium oxide ($ZrO_2$), hafnium silicate (HfSiO), or aluminum oxide ($Al_2O_3$). In some embodiments, the first and second high-k dielectric layers 210, 214 may be substantially equivalent in thickness. Alternatively, the first and second high-k dielectric layers 210, 214 may have different thicknesses depending on the type of device being constructed. For example, a thickness of each of the first and second high-k dielectric layer 210, 214 may be about 10-30 angstroms.

At 104, optionally, a first upper surface 216 of the first film stack 204 may be selectively modified (e.g., without modifying a second upper surface 218 of the second film stack 206) to adjust the effective work function and/or threshold voltage of the device 201 on the substrate 202. Alternatively or in combination, the second upper surface 218 of the second film stack 206 may be selectively modified (e.g., without modifying the first upper surface 216 of the first film stack 204) to adjust the effective work function and/or threshold voltage of the device 203 formed on the substrate 202. As illustrated in FIG. 2A, the first upper surface 216 may be the upper surface of the first high-k dielectric layer 210 and the second upper surface 218 may be the upper surface of the second high-k dielectric layer 214.

Figure 2B:
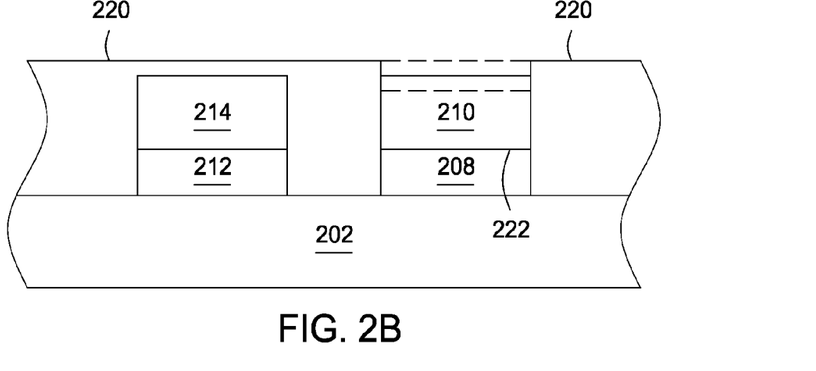

As illustrated in FIG. 2B, and in some embodiments, the first upper surface 216 of the first film stack 204 may be selectively modified (illustrated in FIG. 2B by dotted lines above and below the first upper surface 216). For example, the modification process may begin by depositing a mask 220 that exposes only the first upper surface 216 of the first high-k dielectric layer 210. The mask 220 may be deposited by any suitable methods known in the art. The mask 220 may comprise any suitable masking materials compatible with the modification process at 104. Such masking materials may include one or more of a photoresist, silicon nitride ($Si_3N_4$), or silicon oxide ($SiO_2$) In some embodiments, the mask 220 may comprise carbon (C).

The modification process at 104 may include one or more of the modification processes discussed below including surface mixing, ion implantation, surface reaction, or deposition. Further, in some embodiments, the modification process at 104 does not extend through the first high-k dielectric layer 210 to a first lower surface 222 of the first high-k dielectric layer 210 or through the second high-k dielectric layer 214 to a first lower surface of the second high-k dielectric layer 214.

A surface mixing process may include physically modifying the first upper surface 216, such as to create dangling bonds, lattice defects, high energy surface features, or the like which can make the first upper surface 216 a reactive surface which can sequentially or concurrently be chemically modified. For example, a surface mixing process may include exposing the first upper surface 216 to a non-reactive species to physically modify the first upper surface 216. For example, the non-reactive species may include argon ions (Ar+) or other non-reactive charged species that can be directed to the first upper surface 216, such as by a bias power applied to the substrate 202 by the RF bias power source 342 discussed below. The bias power may be adjusted to increase or decrease the ion flux to the first upper surface 216 thereby controlling the amount of physical modification (i.e., the amount of reactivity) on the first upper surface 216.

Sequentially or concurrently with the physically modification to the first upper surface 216, the first upper surface 216 may be chemically modified. For example, the physically modified first upper surface 216 may be exposed to a reactive species to chemical modify the physically modified first upper surface 216. For example, the reactive species may include one or more of oxygen ions (O—), carbon ions (C—), or nitrogen ions (N—). The reactive species may chemically modify the first upper surface 216 to form one or more of oxides or nitrides. Similar to the non-reactive species discussed above, a bias power may be applied to the substrate 202 by an RF bias power source (e.g., the RF bias power source 342) to adjust the flux of the reactive species to the first upper surface 216 thereby controlling the amount of chemical modification on the first upper surface 216.

For example, in some embodiments, after the surface mixing process, the first upper surface 216 may comprise one or more of hafnium oxynitride ($HfO_xN_y$) or hafnium oxycarbide ($HfO_xC_y$).

Alternatively, or in combination, an ion implantation process may be used to modify the first upper surface of the first high-k dielectric layer 210 as illustrated in FIG. 2B. For example, a plasma may be formed in the process chamber, such as the reactor 300 discussed below. The plasma may be formed from a dopant-containing gas, such as one or more of phosphine ($PH_3$), borane ($BH_3$), or other dopant-containing gases. Dopants may include, for example, one or more of nitrogen (N), phosphorus (P), boron (B), carbon (C), or arsenic (As). The plasma may include an ionized dopant species which may be directed by a bias voltage towards the first upper surface 216 and implanted therein. For example, one or more of the plasma density and or the bias voltage may be controlled, for example, to prevent penetration of the ionized dopant species to a first lower surface 222 of the first high-k dielectric layer 210. For example, in some embodiments, the plasma density may range from about $5\times10^9$ to about $1\times10^{11}$ ions/cm$^3$. For example, in some embodiments, the bias voltage may range from about 100 to about 500 V.

In some embodiments, the ion implantation may extend to a depth ranging from about 0 to about 30 angstroms. In some embodiments, the ion implantation does not extend completely through the layer having the surface being modified. In some embodiments, the concentration of dopants implanted in the first upper surface 216 may range from about $5\times10^{19}$ to about $5\times10^{21}$ atoms/cm$^3$.

Alternatively, or in combination, a surface reaction process may be utilized to modify the first upper surface 216 of the first high-k dielectric layer 210. For example, a surface reaction process may include one or more of oxidation, nitridation, or metallization of the first upper surface 216. For example, in some embodiments, the first upper surface 216 may be exposed to a plasma formed from at least one of a nitrogen-containing gas or an oxygen-containing gas. Exemplary nitrogen-containing gases may include one or more of nitrogen ($N_2$) or nitrous oxide ($N_2O$). Exemplary oxygen-containing gases may include one or more of oxygen ($O_2$), or carbon dioxide ($CO_2$). The plasma may be utilized to at least one of oxidize or nitridize the first upper surface 216 of the first high-k dielectric layer 210.

For example, in some embodiments, an oxidized and/or nitridized first upper surface 216 may include silicon (Si), hafnium (Hf), zirconium (Zr), or aluminum (Al). For example, in some embodiments, the concentration of oxygen incorporated into the first upper surface 216 may range from about 20 to about 50 percent. For example, in some embodiments, the concentration of nitrogen incorporated into the first upper surface may range from about 5 to about 50 percent.

Alternatively, or in combination, a deposition process may be utilized to modify the first upper surface 216 of the first high-k dielectric layer 210. For example, the deposition process may include exposing the first upper surface to a plasma formed from at least one of a metal-containing or oxygen-containing gas to deposit an intermediate layer atop the first upper surface 216. For example, the intermediate layer may include a metal layer, a metal oxide layer, or the combinations thereof. The intermediate layer, similar to the modification processes listed above, may be utilized to adjust the effective work function or threshold voltage of the device 201. Exemplary metal-containing gases may include trimethyl aluminum ($Al_2(CH_3)_6$), diethyl zinc ($Zn(C_2H_5)_2$), trimethyl gallium ($Ga(CH_3)_3$), or other metal-containing gases. Exemplary oxygen-containing gases may include ammonium acetate ($CH_3COONH_4$), zinc acetate ($Zn(CH_3COO)_2 \cdot 2H_2O$), or one or more metal oxides.

For example, in some embodiments, the intermediate layer may include one or more of titanium (Ti), tungsten (W), or aluminum (Al). The intermediate layer may have a thickness ranging from about 4 to about 30 Angstroms.

After the optional modification of the first upper surface of the first high-k dielectric layer 210 is completed, the mask 220 may be stripped by any suitable means known in the art, for example in a mask stripping apparatus or the like. Optionally, a similar modification may be performed on the second upper surface 218 of the second film stack 206. For example, the modification of the second upper surface 218 may proceed by depositing a second patterned mask (not shown) that exposes only the second upper surface 218 and then modifying the exposed second upper surface 218 using one or more of the modification processes discussed above. The modification of the second upper surface 218 may be the same or different from the modification of the first upper surface 216 depending on the desired characteristics of the device 203. For example, the device 203 may be the same or different from the device 201. In the case that the devices are different, for example, one device may be an NMOS device and the other device may be a PMOS device, the modifications of the first and second upper surfaces 216, 218 may be different to adjust effective work function and/or threshold voltage suitable to the needs of the each device. In the case that the devices are the same, for example, each device is an NMOS device or each is a PMOS device, the modification of the first and second upper surfaces 216, 218 may be the same if the devices are desired to operation with the same effective work function and/or threshold voltages. Alternatively, although the devices may be of the same type, the modifications of each of the first and second upper surfaces 216, 218 may be different, for example, if the devices are utilized for different functions that require different levels of effective work function and/or threshold voltage.

Figure 2C:
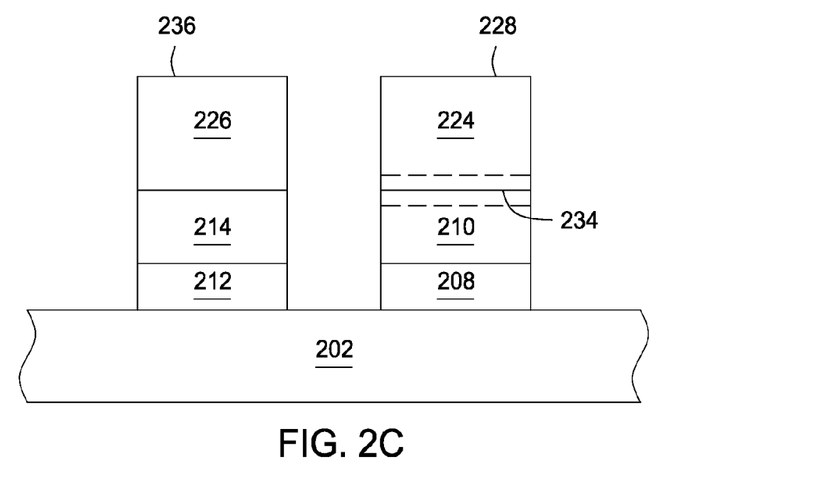

At 106, a first metal layer 224 may be deposited atop the first film stack 204 and a second metal layer 226 may be deposited atop the second film stack 206, as illustrated in FIG. 2C. The first and second metal layers 224, 226 may be deposited by any suitable process, for example, such as a deposition process performed in the same process chamber utilized for the optional modification at 104, such as the reactor 300 described below, or alternatively, another suitable chamber, such as one configured for physical vapor deposition (PVD), chemical vapor deposition (CVD), atomic layer deposition (ALD) or the like. The first and second metal layers 224, 226 may be substantially equivalent in composition and thus deposited simultaneously by a substantially similar process, such as one or more of the processes mentioned above. Alternatively, in some embodiments, the metal layers 224, 226 may be different in composition. The metal layers 224, 226 may be deposited to thicknesses ranging from about 30 to about 100 angstroms. In some embodiments, the thicknesses of each metal layer 224, 226 may be about 70 angstroms. In some embodiments, the first and second metal layers 224, 226 may have substantially equivalent thicknesses.

The first and second metal layers 224, 226 may comprise any suitable metal, metal alloy or metal-containing material that are capable of functioning with the devices 201, 203 to produce a desired effective work function and/or threshold voltage of the devices. Exemplary metals, metal alloys or metal-containing materials that may comprise the metal layers 224, 226 may include one or more (titanium nitride (TiN), tantalum nitride (TaN), tungsten (W), or aluminum (Al).

Due to the optional modification at 104 and/or a modification at 108 discussed below, the method 100 may advantageously allow for the deposition of metal layers on the adjacent devices 201, 203 that are substantially equivalent in composition even if the devices 201, 203 are different types, such as one NMOS device and the other a PMOS device. For example, the method 100 advantageously may eliminate additional process steps, such as hardmask and PVD steps, associated with depositing metal layers having different compositions for each device 201, 203.

Figure 2D:
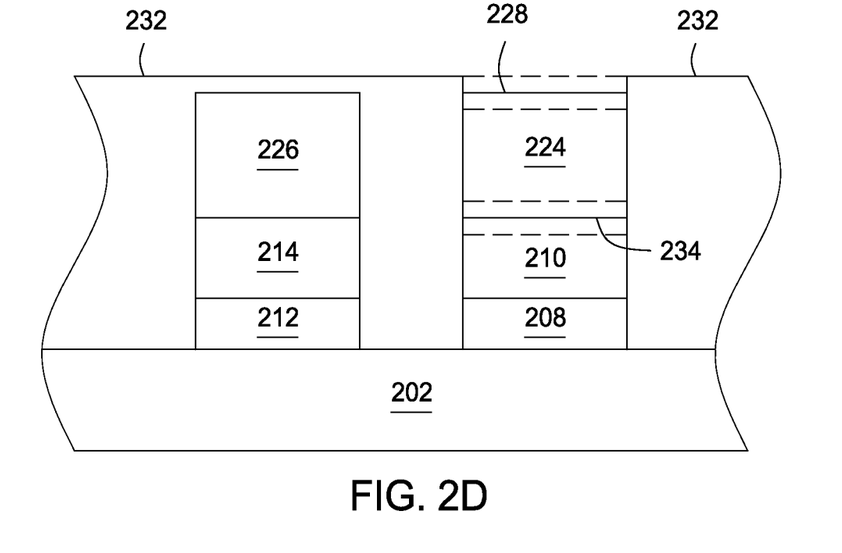
Figure 2E:
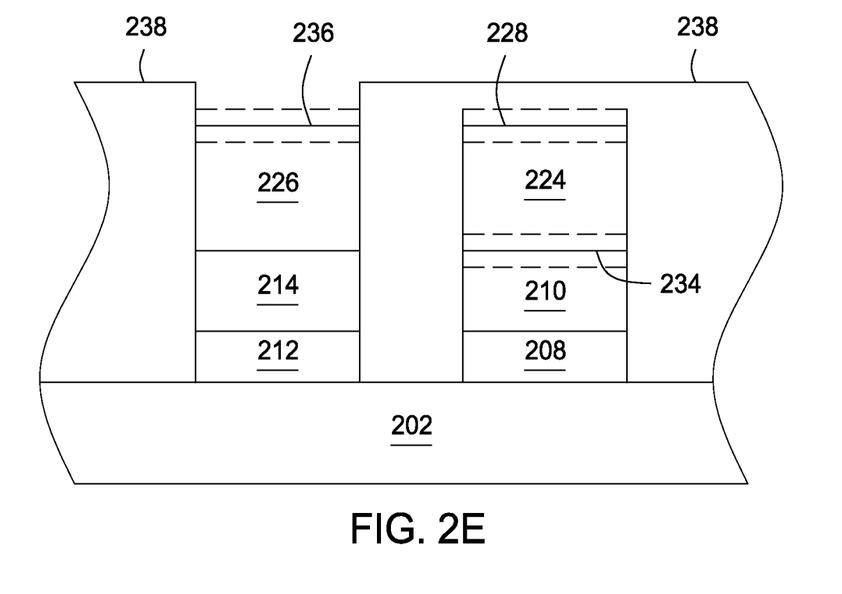

At 108, a first upper surface 228 of the first metal layer 224 may be selectively modified to adjust the effective work function or threshold voltage of the device 201 formed on the substrate 202. Alternatively or in combination, a second upper surface 230 of the second metal layer 226 may be selectively modified to adjust the effective work function or threshold voltage of the device 203 formed on the substrate 202.

As illustrated in FIG. 2D, and in one exemplary embodiment, the first upper surface 228 of the first metal layer 224 may be selectively modified (illustrated by the dotted lines above and below the first upper surface 228 as shown in FIG. 2D). For example, the modification process may begin by depositing a mask 232 that exposes only the first upper surface 228 of the first metal layer 224. The mask 232 may be deposited by any suitable methods known in the art, and may comprise any suitable masking materials compatible with the modification process at 108, such as one or more of the masking materials listed above.

Similar to the modification process at 104, the modification at 108 may include one or more of surface mixing, ion implantation, surface reaction, or deposition. Further, the modification process at 108 may not extend through the first metal layer 224 to a first lower surface 234 of the first metal layer 224.

For example, a surface mixing process may be utilized to modify the first upper surface 228 of the first metal layer 224. The surface mixing process may be substantially similar to the surface mixing process described above for the first upper surface 216 of the first high-k dielectric layer 210. For example, the first upper surface 228 may be physically modified and concurrently or sequentially chemically modified. For example, in some embodiments, after the surface mixing process, the first upper surface 228 may comprise one or more of oxygen, nitrogen, or silicon.

Alternatively, or in combination, an ion implantation process may be used to modify the first upper surface 228 of the first metal layer 224 as illustrated in FIG. 2D. The ion implantation process may be substantially similar to the ion implantation process described above for the first upper surface 216 of the first high-k dielectric layer 210. For example, in some embodiments, the plasma density may range from about $1\times10^{10}$ to about $1\times10^{11}$ ions/cm$^3$. For example, in some embodiments, the bias voltage may range from about 250 to about 1000 V. For example, in some embodiments, the ion implantation may extend to a depth ranging from about 10 to about 50 angstroms in the first metal layer 224. For example, in some embodiments, the concentration of dopants implanted in the first upper surface 228 may range from about 5 to about 50 percent.

Alternatively, or in combination, a surface reaction process may be utilized to modify the first upper surface 228 of the first metal layer 224. The surface reaction process may be substantially similar to the surface reaction process described above for the first upper surface 216 of the first high-k dielectric layer 210. For example, a surface reaction process may include one or more of oxidation, nitridation, metallization of the first upper surface 216.

For example, in some embodiments, an oxidized and/or nitridized first upper surface 228 may include titanium nitride (TiN), titanium oxynitride (TiON), or tantalum nitride (TaN). For example, in some embodiments, the concentration of oxygen incorporated into the first upper surface 228 may range from about 10 to about 20 percent. For example, in some embodiments, the concentration of nitrogen incorporated into the first upper surface 228 may range from about 30 to about 50 percent.

Alternatively, or in combination, a deposition process may be utilized to modify the first upper surface 228 of the first metal layer 224. The deposition process may be substantially similar to the deposition process described above for the first upper surface 216 of the first high-k dielectric layer 210. For example, the deposition process may form an intermediate layer of the first upper surface 228. For example, the intermediate layer may include a metal layer, a metal oxide layer, or the combinations thereof. The intermediate layer, similar to the modification processes listed above, may be utilized to adjust the effective work function or threshold voltage of the device 201. For example, in some embodiments, the intermediate layer may include one or more of titanium nitride (TiN), tantalum nitride (TaN), or titanium silicon (TiSi). The intermediate layer may have a thickness ranging from about 20 to about 50 Angstroms.

Figure 2F:
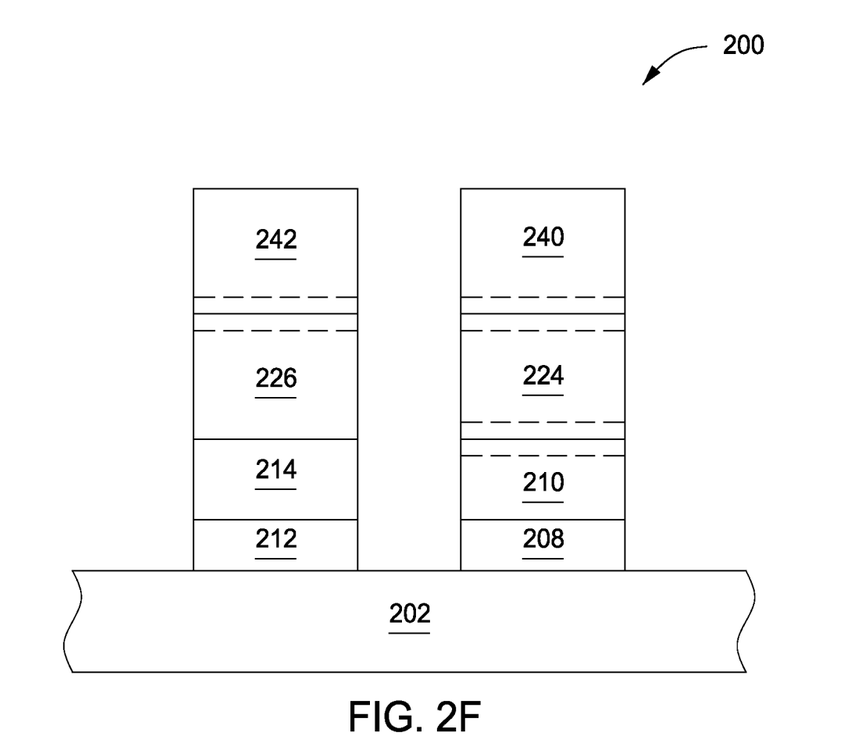

Upon completion of the modification of the first upper surface 228 of the first metal layer 224, the method 100 may proceed to 110 if a second upper surface 236 of the second metal layer 226 does not require modification, for example to adjust effective work function and/or threshold voltage of the device 203. Alternatively, as illustrated in FIG. 2F, the second upper surface 236 of the second metal layer 226 may be modified (as illustrated by dotted lines above and below the second upper surface 236 in FIG. 2F) in a similar or different manner using one or more of the modification processes discussed above to adjust the effective work function and/or threshold voltage of the device 203 to a desired value. Similar to the methods discussed above for modifying the first upper surface 228 of the first metal layer 224, a patterned mask 238 may be applied such that only the second upper surface 236 is exposed. The second upper surface 236 may then be modified using one or more of the modification processes discussed above, after which the mask 238 may be stripped by any suitable stripping process as discussed above.

The modification of the second upper surface 236 may be the same or different from the modification of the first upper surface 228 depending on the desired characteristics of the device 203. For example, the device 203 may be the same or different from the device 201. In the case that the devices are different, for example, one device may be an NMOS device and the other device may be a PMOS device, the modifications of the first and second upper surfaces 228, 236 may be different to adjust effective work function and/or threshold voltage suitable to the needs of the each device. In the case that the devices are the same, for example, each device is an NMOS device or each is a PMOS device, the modification of the first and second upper surfaces 228, 236 may be the same if the devices are desired to operation with the same effective work function and/or threshold voltages. Alternatively, although the devices may be of the same type, the modifications of each of the first and second upper surfaces 228, 236 may be different, for example, if the devices are utilized for different functions that require different levels of effective work function and/or threshold voltage.

At 110, a first polysilicon or metal layer 240 may be deposited atop the first metal layer 224 and a second polysilicon or metal layer 242 may be deposited atop the second metal layer 226 as illustrated in FIG. 2F. For example, the first and second polysilicon or metal layers 240, 242 may be deposited by any suitable means, such as CVD, PVD or the like. The first and second polysilicon or metal layers 240, 242 may be substantially equivalent in composition and deposited simultaneously. In some embodiments, the first and second polysilicon or metal layers 240, 242 may have substantially equivalent thicknesses. In some embodiments, the thicknesses of the first and second polysilicon and metal layers 240, 242 may range from about 500 to about 1000 angstroms. The first and second polysilicon or metal layers 240, 242 may include any suitable materials for providing the desired effective work function and/or threshold voltages to the devices 201, 203. For example, the first and second polysilicon or metal layers 240, 242 may include one or more polysilicon (poly Si), tungsten (W), or aluminum (Al).

Embodiments of the present invention may be performed in toroidal source plasma ion immersion implantation reactor such as, but not limited to, the P3i reactor commercially available from Applied Materials, Inc., of Santa Clara, Calif. Such a suitable reactor and its method of operation are set forth in U.S. Pat. No. 7,166,524, assigned to the assignee of the present invention.

Figure 3:
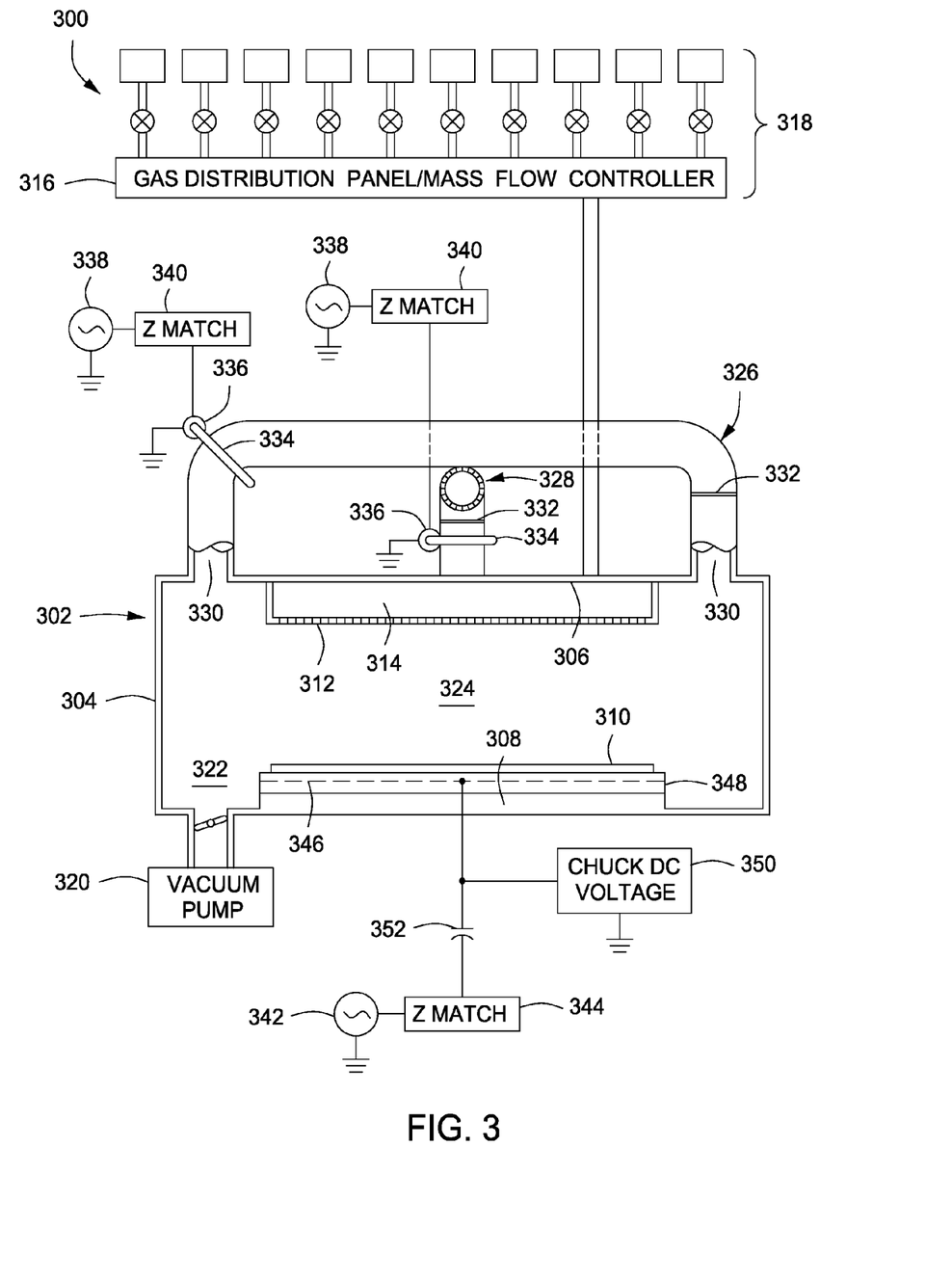
FIG. 3 depicts a plasma reactor in accordance with some embodiments of the present invention.

Referring to FIG. 3, a toroidal source plasma immersion ion implantation ("P3i") reactor 300 of the type disclosed in the above-reference application has a cylindrical vacuum chamber 302 defined by a cylindrical side wall 304 and a disk-shaped ceiling 306. A substrate support pedestal 308 at the floor of the chamber supports a substrate 310 (e.g., substrate 202 with film stacks 204, 206 disposed thereon) to be processed. A gas distribution plate or showerhead 312 on the ceiling 306 receives process gas in its gas manifold 314 from a gas distribution panel 316 whose gas output can be any one of or mixtures of gases from one or more individual gas supplies 318. A vacuum pump 320 is coupled to a pumping annulus 322 defined between the substrate support pedestal 308 and the sidewall 304. A processing region 324 is defined between the substrate 310 and the gas distribution plate 312.

Pair of external reentrant conduits 326, 328 establishes reentrant toroidal paths for plasma currents passing through the processing region 324, the toroidal paths intersecting in the processing region 324. Each of the conduits 326, 328 has a pair of ends 330 coupled to opposite sides of the chamber. Each conduit 326, 328 is a hollow conductive tube. Each conduit 326, 328 has a D.C. insulation ring 332 preventing the formation of a closed loop conductive path between the two ends of the conduit.

An annular portion of each conduit 326, 328, is surrounded by an annular magnetic core 334. An excitation coil 336 surrounding the core 334 is coupled to an RF power source 338 through an impedance match device 340. The two RF power sources 338 coupled to respective ones of the cores 336 may be of two slightly different frequencies. The RF power coupled from the RF power generators 338 produces plasma ion currents in closed toroidal paths extending through the respective conduit 326, 328 and through the processing region 324. These ion currents oscillate at the frequency of the respective RF power source 338. Bias power is applied to the substrate support pedestal 308 by a bias power generator 342 through an impedance match circuit 344.

Plasma formation is performed by introducing a process gas, or mixture of process gases into the chamber 324 through the gas distribution plate 312 and applying sufficient source power from the generators 338 to the reentrant conduits 326, 328 to create toroidal plasma currents in the conduits and in the processing region 324. The plasma flux proximate the wafer surface is determined by the wafer bias voltage applied by the RF bias power generator 342. The plasma rate or flux (number of ions sampling the wafer surface per square cm per second) is determined by the plasma density, which is controlled by the level of RF power applied by the RF source power generators 338. The cumulative ion dose (ions/square cm) at the wafer 310 is determined by both the flux and the total time over which the flux is maintained.

If the wafer support pedestal 308 is an electrostatic chuck, then a buried electrode 346 is provided within an insulating plate 348 of the wafer support pedestal, and the buried electrode 346 is coupled to a user-controllable D.C. chucking voltage supply 350 and to the bias power generator 342 through the impedance match circuit 344 and through an optional isolation capacitor 352 (which may be included in the impedance match circuit 344).

In operation, and for example, the substrate 310 may be placed on the substrate support pedestal 308 and one or more process gases may be introduced into the chamber 302 to strike a plasma from the process gases.

In operation, a plasma may be generated from the process gases within the reactor 300 to selectively modify surfaces of the substrate 310 as discussed above. The plasma is formed in the processing region 324 by applying sufficient source power from the generators 338 to the reentrant conduits 326, 328 to create plasma ion currents in the conduits 326, 328 and in the processing region 324 in accordance with the process described above. In some embodiments, the wafer bias voltage delivered by the RF bias power generator 342 can be adjusted to control the flux of ions to the wafer surface, and possibly one or more of the thickness a layer formed on the wafer or the concentration of plasma species embedded in the wafer surface. In some embodiments, no bias power is applied.

Methods for forming a device on a substrate are disclosed herein. The inventive methods may advantageously reduce the number of process steps required to manufacture, for example a complementary metal oxide semiconductor (CMOS) device including both an n-type metal oxide semiconductor (NMOS) device and p-type metal oxide semiconductor (PMOS) device on the same substrate, or any one or more NMOS and/or PMOS devices on the same substrate. The inventive methods may facilitate increased process throughput due to the reduced number of process steps.

While the foregoing is directed to embodiments of the present invention, other and further embodiments of the invention may be devised without departing from the basic scope thereof.

The invention claimed is:

1. A method of forming a device on a substrate, comprising:
   providing a substrate having a partially fabricated first device disposed on the substrate, the first device including a first film stack comprising a first dielectric layer and a first high-k dielectric layer disposed atop the first dielectric layer;
   depositing a first metal layer atop the first film stack; and
   modifying a first upper surface of the first metal layer by exposing the first upper surface to a non-reactive species to physically modify the exposed first upper surface to form at least one of dangling bonds or lattice defects atop and by exposing the physically modified first upper surface to a reactive species to chemically modify the first upper surface to adjust a first threshold voltage of the first device, wherein the modification of the first upper surface does not extend through to a first lower surface of the first metal layer.

2. The method of claim 1, further comprising:
depositing a first polysilicon or metal layer atop the modified first upper surface of the first metal layer.

3. The method of claim 1, further comprising:
modifying a first upper surface of the first high-k dielectric layer to adjust a first work function of the first gate stack prior to depositing the first metal layer, wherein the modification of the first upper surface of the first high-k dielectric layer does not extend through to a first lower surface of the first high-k dielectric layer.

4. The method of claim 1, wherein modifying the first upper surface of the first metal layer further comprises:
forming a plasma from a dopant-containing gas, wherein the plasma includes ionized dopant species; and
applying a bias voltage to the substrate to implant the ionized dopant species into the first upper surface.

5. The method of claim 1, wherein modifying the first upper surface of the first metal layer further comprises:
exposing the first upper surface to a plasma formed from at least one of a nitrogen-containing gas or an oxygen-containing gas; and
at least one of oxidizing or nitridizing the first upper surface using the plasma.

6. The method of claim 1, wherein modifying the first upper surface of the first metal layer further comprises:
exposing the first upper surface to a plasma formed from at least one of a metal-containing gas or an oxygen-containing gas; and
depositing an intermediate layer formed from the plasma atop the first upper surface.

7. The method of claim 1, wherein a partially fabricated second device is disposed on the substrate, the second device including a second film stack comprising a second dielectric layer and a second high-k dielectric layer disposed atop the second dielectric layer, wherein the second dielectric layer is substantially equivalent in composition to the first dielectric layer of the first film stack and wherein the second high-k dielectric layer is substantially equivalent in composition to the first high-k dielectric layer.

8. The method of claim 7, further comprising:
depositing a second metal layer atop the second film stack simultaneously with the deposition of the first metal layer, wherein the second metal layer is substantially equivalent in composition to the first metal layer.

9. The method of claim 8, wherein modifying the first upper surface of the first metal layer further comprises:
depositing a first patterned mask that exposes only the first upper surface; and
modifying the first upper surface exposed by the first patterned mask.

10. The method of claim 9, further comprising:
depositing a first polysilicon or metal layer atop the modified first upper surface of the first metal layer; and
depositing a second polysilicon or metal layer atop a second upper surface of the second metal layer, wherein the first and second polysilicon or metal layers are deposited simultaneously and substantially equivalent in composition.

11. The method of claim 10, wherein the first threshold voltage of the first device is different than a second threshold voltage of the second device.

12. The method of claim 11, wherein the first device is an NMOS device and the second device is a PMOS device.

13. The method of claim 9, further comprising:
modifying a second upper surface of the second metal layer to adjust a second threshold voltage of the second device, wherein the modification of the second upper surface does not extend through to a second lower surface of the second metal layer, wherein modifying the second upper surface further comprises:
depositing a second patterned mask that exposes only the second upper surface; and
modifying the second upper surface exposed by the second patterned mask.

14. The method of claim 13, further comprising:
depositing a first polysilicon or metal layer atop the modified first upper surface of the first metal layer; and
depositing a second polysilicon or metal layer atop the second upper surface of the second metal layer, wherein the first and second polysilicon or metal layers are deposited simultaneously and substantially equivalent in composition, and wherein the first threshold voltage of the first device is different than a second threshold voltage of the second device.

15. The method of claim 14, wherein the first device is an NMOS device and the second device is a PMOS device.

16. The method of claim 8, further comprising:
modifying a first upper surface of the first high-k dielectric layer to adjust the first threshold voltage of the first device prior to depositing the first and second metal layers, wherein the modification of the first upper surface of the first high-k dielectric layer does not extend through to a first lower surface of the first high-k dielectric layer, wherein modifying the first upper surface of the first high-k dielectric layer comprises:
depositing a first patterned mask that exposes only the first upper surface of the first high-k dielectric layer; and
modifying the first upper surface of the first high-k dielectric layer exposed by the first patterned mask.

17. The method of claim 16, further comprising:
depositing a first polysilicon or metal layer atop the modified first upper surface of the first metal layer; and
depositing a second polysilicon or metal layer atop a second upper surface of the second metal layer, wherein the first and second polysilicon or metal layers are deposited simultaneously and substantially equivalent in composition.

18. The method of claim 17, wherein the first threshold voltage of the first device is different than a second threshold voltage of the second device.

19. The method of claim 18, wherein the first device is an NMOS device and the second device is a PMOS device.

20. A method of forming a device on a substrate, comprising:
providing a substrate having a partially fabricated first device disposed on the substrate, the first device including a first film stack comprising a first dielectric layer and a first high-k dielectric layer disposed atop the first dielectric layer;
depositing a first metal layer atop the first film stack;
physically modifying a first upper surface of the first metal layer via exposure to a non-reactive species to form at least one of dangling bonds or lattice defects atop the exposed first upper surface; and
exposing the physically modified first upper surface to a reactive species to chemically modify the first upper surface to adjust a first threshold voltage of the first device, wherein the modification of the first upper surface does not extend through to a first lower surface of the first metal layer.

* * * * *